United States Patent
Fujii

[11] Patent Number: 5,825,265
[45] Date of Patent: Oct. 20, 1998

[54] GROUNDED INDUCTANCE CIRCUIT USING A GYRATOR CIRCUIT

[75] Inventor: Tomohiro Fujii, Tokyo, Japan

[73] Assignee: NEC Corporation, Tokyo, Japan

[21] Appl. No.: 566,022

[22] Filed: Dec. 1, 1995

[30] Foreign Application Priority Data

Dec. 5, 1994 [JP] Japan ................................. 6-329258

[51] Int. Cl.$^6$ ............................................. H03H 11/50
[52] U.S. Cl. .................................................. 333/215
[58] Field of Search .............................. 333/214, 215

[56] References Cited

U.S. PATENT DOCUMENTS 4,381,489  4/1983  Canning et al. ..................... 333/215
5,093,642  3/1992  Mittel ................................. 333/215

FOREIGN PATENT DOCUMENTS 1208011  8/1989  Japan .

OTHER PUBLICATIONS

D.W.H. Calder, "Audio Frequency Gyrator Filters for An Integrated Radio Paging Receiver", International Conference Mobile Radio Systems and Techniques, Sep., 1984, pp. 21–22.

*Primary Examiner*—Paul Gensler
*Attorney, Agent, or Firm*—Sughrue, Mion, Zinn, Macpeak & Seas

[57] ABSTRACT

First and second transconductance amplifiers OTA 1, OTA 2, each having two input terminals, and two output terminals are constructed in such a manner that a first input terminal of the OTA 1 is connected with a second output terminal of the OTA 2, a first output terminal of the OTA 1 and a first input terminal of the OTA 2 are connected to a capacitor which is grounded at one end, and a second input terminal and a second output terminal of the OTA 1 and a second input terminal and a first output terminal of the OTA 2 are AC-grounded.

6 Claims, 5 Drawing Sheets

GROUNDED INDUCTANCE CIRCUIT USING A GYRATOR CIRCUIT

BACKGROUND OF THE INVENTION

1. Field of the Invention

This invention relates to a grounded inductance circuit, and more particularly to a grounded inductance circuit using a gyrator circuit.

2. Description of the Related Art

There has been proposed a grounded inductance circuit using a gyrator circuit in which two input terminals and two output terminals of first and second operational transconductance amplifiers (OTAs) are connected to each other, with a capacitor connecting the two input terminals of the second OTA or the two output terminals of the first OTA, and one of the input terminals of the first OTA is AC-grounded.

However, in practice this type of circuit cannot operate as a grounded inductance circuit, though theoretically it may be a grounded inductance circuit.

SUMMARY OF THE INVENTION

It is an object of this invention to overcome the above-mentioned problem by providing a grounded inductance circuit using a gyrator circuit which in practice functions as a grounded inductance circuit.

It is another object of this invention to provide a grounded inductance circuit using a gyrator circuit which is free of DC bias fluctuation and thus has stable characteristics, as described later.

The grounded inductance circuit using a gyrator circuit according to this invention is constructed as a circuit wherein a first input terminal of a first transconductance amplifier is connected with a second output terminal of a second transconductance amplifier, a first output terminal of the first transconductance amplifier and a first input terminal of the second transconductance amplifier are connected with one end of a capacitor which is grounded at the other end, and a second input terminal and a second output terminal of the first transconductance amplifier and a second input terminal and a first output terminal of the second transconductance amplifier are AC-grounded, respectively.

Also, this invention has an additional characteristic aspect in that the first and the second transconductance amplifiers are constructed as current-loaded circuits, and the current sources for the load currents are constructed with a current amplifier.

The first transconductance amplifier comprises a pair of first differential transistors; a pair of second differential transistors with bases and collectors connected in common with those of the pair of first differential transistors; a pair of current-loading, third transistors; and a pair of fourth transistors which are connected in common with emitters of the pairs of first and second differential transistors and make up constant-current sources.

The second transconductance amplifier comprises a pair of fifth differential transistors; a pair of sixth differential transistors with bases and collectors connected in common with those of the pair of fifth differential transistors; a pair of current-loading, seventh transistors; and a pair of eighth transistors which are connected in common with emitters of the pairs of fifth and sixth differential transistors and make up constant-current sources.

The respective bases of the third and the seventh transistors are connected in common with the base of a ninth transistor with its collector and base connected to each other (collector-base connection), and the bases of the fourth and the eighth transistors are connected in common with the base of the output end transistor of a pair of tenth transistors which form a current mirror circuit.

According to this invention, a circuit, which is free of DC bias fluctuation and has an exceedingly stable bias balance, may be constructed by establishing a connection between the first input terminal of the OTA 1 and the second output terminal of the OTA 2, connecting the first output terminal of the OTA 1 and the first input terminal of the OTA 2 to a capacitor which is grounded at one end, and AC-grounding the second input terminal and the second output terminal of the OTA 1 and the second input terminal and the first output terminal of the OTA 2.

BRIEF DESCRIPTION OF THE DRAWINGS

These and other objects, features and advantages of this invention will become more fully apparent from the following detailed description taken together with the accompanying drawings in which.

In the drawings, the same reference numerals denote the same structural elements.

DESCRIPTION OF THE PREFERRED EMBODIMENTS

First, for ease of understanding the invention, an explanation will be given regarding a ground inductance circuit using a gyrator circuit which has been proposed by the prior art, with reference to FIG. 1 through FIG. 4.

Figure 1:
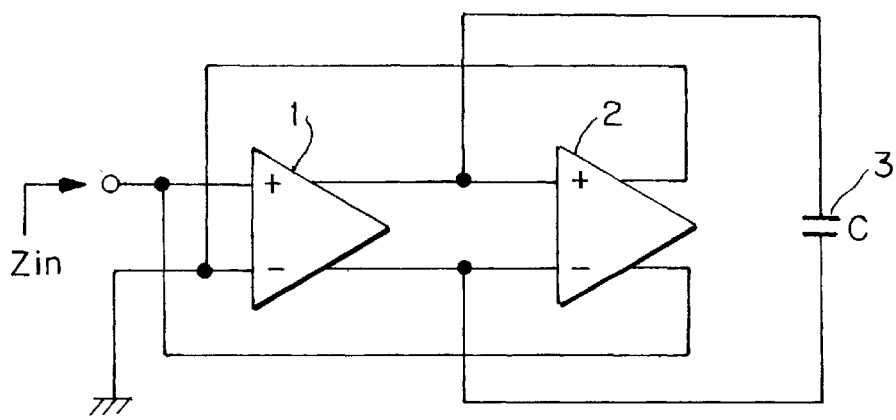
FIG. 1 is a block diagram illustrative of the configuration of a grounded inductance using a gyrator circuit which has been proposed by the prior art.

FIG. 1 is a schematic diagram of the ground inductance circuit using a gyrator circuit which is described in Japanese Unexamined Patent Application Disclosure HEI 1-208011.

In FIG. 1, two input terminals and two output terminals of each of first and second operational transconductance amplifiers (OTAs) 1, 2 are connected to each other, with a capacitor 3 connecting the two input terminals of the OTA 2 or the two output terminals of the OTA 1. With this configuration, one of the input terminals of the OTA 1 is AC-grounded.

An explanation will now be given regarding the operational principle of the ground inductance circuit using a gyrator circuit according to the prior art with reference to FIG. 2.

Figure 2:
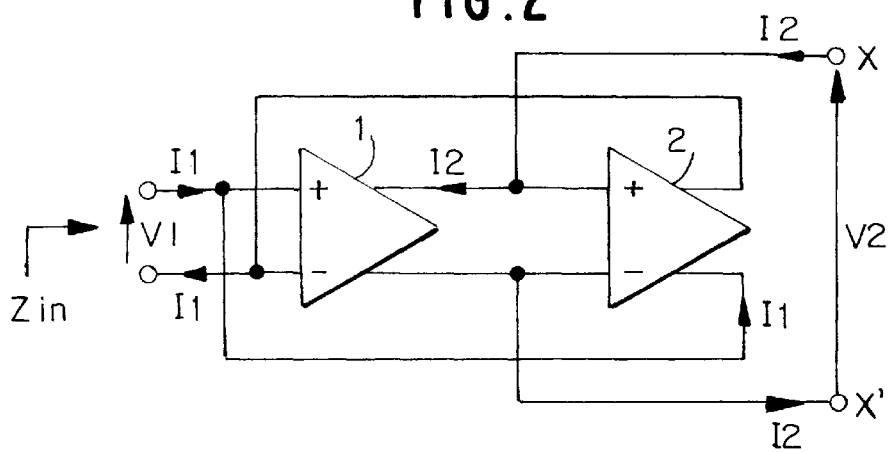
FIG. 2 is a block diagram illustrative of the operational-principle of the grounded inductance shown in FIG. 1.

In FIG. 2, the transconductance of the first and the second OTAs 1, 2 is represented by G, the following Equation (1) holds when the parameter Y is used, in order for the circuit to operate as a gyrator.

$$\begin{pmatrix} I1 \\ I2 \end{pmatrix} = \begin{pmatrix} O & -G \\ G & O \end{pmatrix} \begin{pmatrix} V1 \\ V2 \end{pmatrix} \quad (1)$$

I1 and I2 represent currents passing through the OTAs 1 and 2, respectively, and V1 and V2 represents voltages applied to the OTAs 1 and 2, respectively.

Equation (1) may be rewritten as Equations (2) and (3).

$$I1 = -G \cdot V2 \quad (2)$$

$$I2 = G \cdot V1 \quad (3)$$

In addition, the transconductance G, being the inverse of the impedance, is given by Equation (4), and Equation (5) is derived from Equations (2), (3) and (4).

$$G = 1/Rg \quad (4)$$

$$\frac{V1}{I1} = -Rg^2 \cdot \frac{I2}{V2} \quad (5)$$

In Equation (5), the $-V2/I2$ may be replaced by the impedance with respect to the terminals X-X', as shown in FIG. 2. Representing the impedance of each of the input end and the output end as Z1 and Z2, Equation (6) given below is derived.

$$Z1 = \frac{Rg^2}{Z2} \quad (6)$$

In cases where a capacitor (capacity=C) is placed between the terminals X-X', the impedance Z2 is given by Equation (7).

$$Z2 = 1/j\omega C \quad (7)$$

wherein $j^2 = -1$, and $\omega = 2\pi f$ where f is the frequency.

Substitution of Equation (7) into Equation (6) yields Equation (8) which determines the impedance Z1.

$$Z1 = j\omega C Rg^2 \quad (8)$$

Assuming that $Z1 = j\omega L$, the inductance L is given by Equation (9).

$$L = Rg^2 C \quad (9)$$

Figure 3:
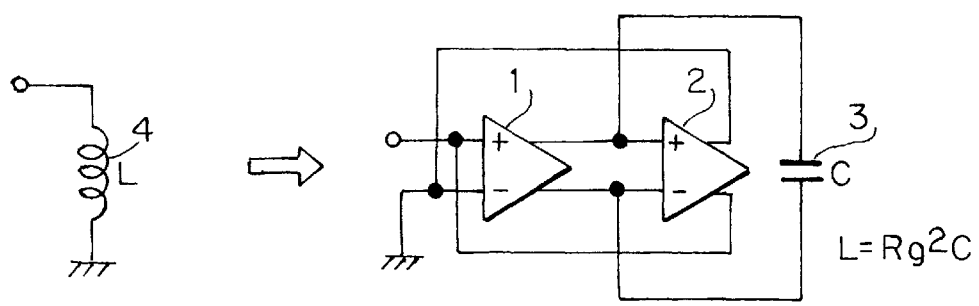
FIG. 3 is another block diagram illustrative of the operational principle of the grounded inductance shown in FIG. 1.

Accordingly, grounding of the minus end input terminal of the OTA 1 as shown in FIG. 3 results in formation of a grounded inductance circuit.

Figure 4:
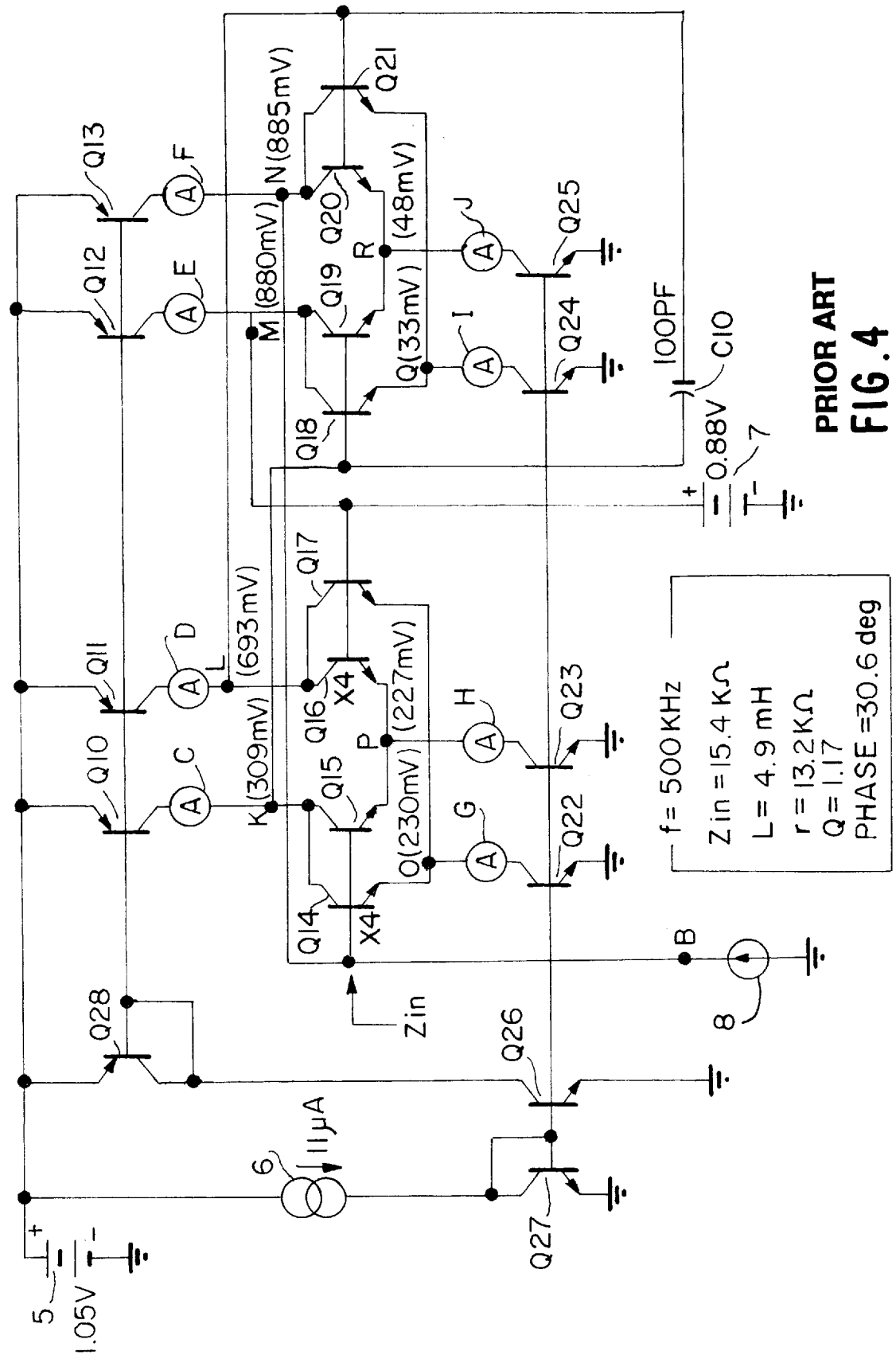
FIG. 4 is a circuit diagram of the grounded inductance shown in FIG. 1.

A practical instance of the grounded inductance circuit using a gyrator circuit according to the prior art is illustrated in FIG. 4.

FIG. 4 also refers to D.C. biases at main nodes in cases where the power-supply voltage is set to 1.05 V, the bias to the analog ground line (AC-grounded line) to 0.88 V, and the capacity to 100 pF. These D.C. biases were determined based on the results of a simulation with a circuit simulator such as AWB or SPICE.

The results of the simulation show that the biases applied to the respective input terminals and output terminals of the OTAs differ greatly, and the transistors are saturated at all the points and thus do not operate normally. Since the series resistance component r=13.2 kΩ for Zin=15.4 kΩ in cases where f=500 kHz, the value of the grounded inductance is substantially of the series resistance component.

As a result, according to the characteristic figures of the inductance, Q=1.17, PHASE=30.6 deg (ideally, Q=∞, phase (PHASE)=90 deg), and thus it is understood that in practice the inductance is substantially useless as a grounded inductance.

For the foregoing reasons, the grounded inductance circuit using a gyrator circuit according to the prior art has the problem of being substantially incapable of use as a practical circuit, though theoretically it may be a grounded inductance.

Embodiments of the present invention will now be explained with reference to FIGS. 5 through 8.

Figure 5:
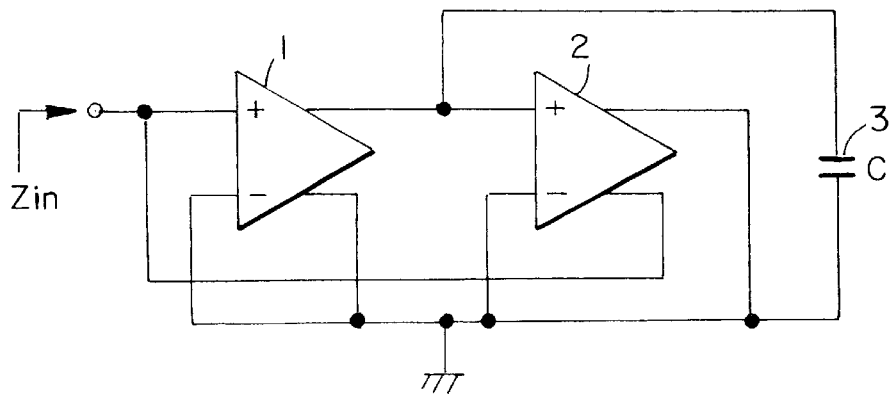
FIG. 5 is a block diagram illustrative of the configuration of the grounded inductance using a gyrator circuit according to an embodiment of this invention.

FIG. 5 is a block diagram illustrative of the configuration of an embodiment of this invention. As shown in FIG. 5, the embodiment is constructed as a circuit where a first input terminal (here, a non-inverting input terminal) of a first transconductance amplifier 1 (hereunder abbreviated as "OTA 1") and a second output terminal of a second transconductance amplifier (hereunder abbreviated as "OTA 2") are connected to each other, a first output terminal of the OTA 1 and a first input terminal (a non-inverting input terminal) of the OTA 2 are connected to one end of a capacitor 3 which is grounded at the other end, and a second input terminal and a second output terminal of the OTA 1 and a second input terminal and a first output terminal of the OTA 2 are AC-grounded.

Figure 6:
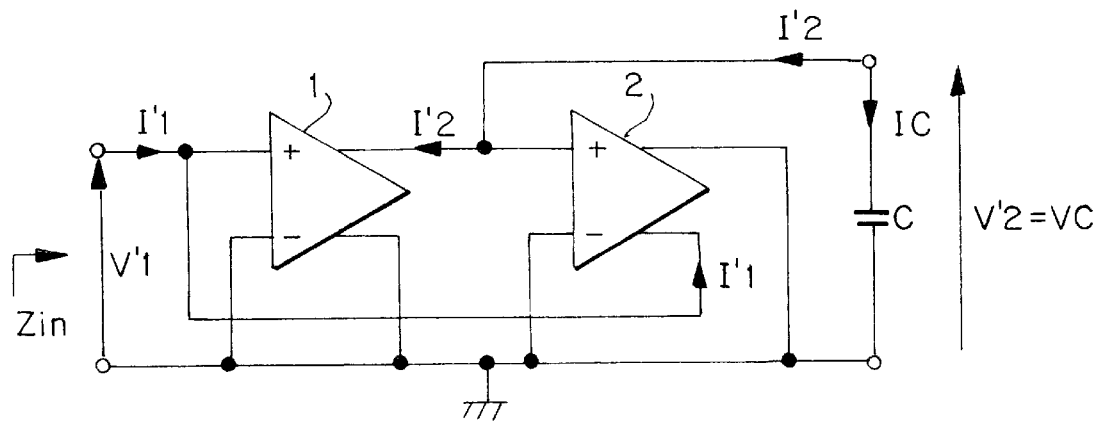
FIG. 6 is a block diagram illustrative of the operational principle of the grounded inductance shown in FIG. 5.
Figure 6:
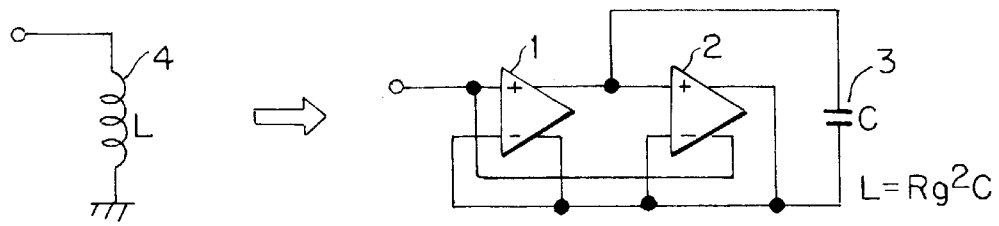

FIG. 6 is a block diagram illustrative of the operational principle of the embodiment of this invention.

The operational principle of the grounded inductance using a gyrator circuit according to the present embodiment will now be explained in detail with reference to FIG. 6.

In FIG. 6, the transconductance of the OTAs is represented by G, and Equation (10) given below holds when the parameter Y is used, in order for the circuit to operate as a gyrator.

$$\begin{pmatrix} I1' \\ I2' \end{pmatrix} = \begin{pmatrix} O & -G \\ G & O \end{pmatrix} \begin{pmatrix} V1' \\ V2' \end{pmatrix} \quad (10)$$

Equation (10) may be rewritten as Equations (11) and (12).

$$I1' = -G \cdot V2' \quad (11)$$

$$I2' = G \cdot V1' \quad (12)$$

In addition, the voltage V2' and the current I2' are given by Equations (13) and (14), respectively.

$$V2' = Vc = Ic/j\omega C \quad (13)$$

$$I2' = -Ic \quad (14)$$

Being the inverse of the impedance, the transconductance G is given by Equation (15):

$$G = 1/Rg \quad (15)$$

Accordingly, Equation (16) is derived from Equations (11) through (15).

$$\frac{V1'}{I1'} = -\frac{I2'IG}{-GVc} = -\frac{1}{G^2} \cdot \frac{-Ic}{Vc} = Rg^2 \cdot \frac{Ic}{Vc} \qquad (16)$$

Representing the impedance with respect to the input end as Z1', Equation (17) given below is held.

$$Z1' = j\omega CRg^2 \qquad (17)$$

Assuming that $Z = j\omega L$, the inductance L is given by Equation (18):

$$L = Rg^2 C \qquad (18)$$

As described above, it is understood that the circuit according to the present embodiment forms a grounded inductance.

An explanation will now be given regarding an actual circuit realizing the grounded inductance circuit using a gyrator circuit according to the embodiment of this invention, with reference to FIG. 7.

Figure 7:
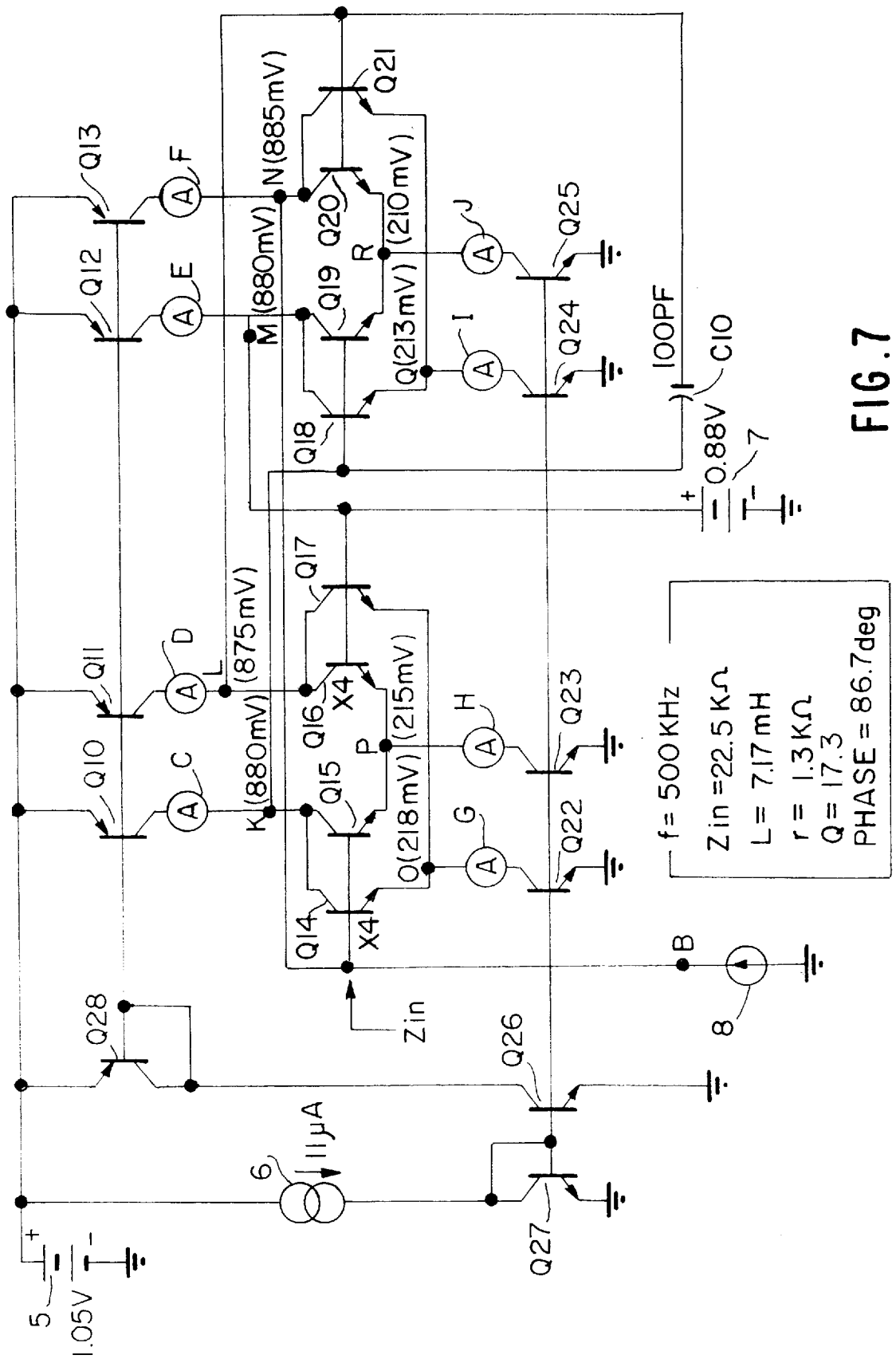
FIG. 7 is a circuit diagram illustrative of the grounded inductance using a gyrator circuit according to the embodiment of this invention.

FIG. 7 illustrates an actual circuit according to the embodiment of this invention.

Referring to FIG. 7, a first transconductance amplifier comprises a pair of differential transistors Q15, Q16; a pair of differential transistors Q14, Q17 with bases and collectors connected in common with those of the pair of differential transistors Q15, Q16; current-loading transistors Q10, Q11; and transistors Q22, Q23 which form constant-current sources connected in common with emitters of the respective pairs of differential transistors. A second transconductance amplifier comprising differential transistors Q19, Q20, etc. is likewise formed. The capacitor C10 is the counterpart of the capacitor 3 shown in FIG. 5. The bases of the PNP transistors Q10 through Q13, which load the first and the second transconductance amplifiers with current, are connected in common with the base of a transistor Q28 with its collector and base connected to each other (collector-base connection), while the bases of NPN transistors Q22 through Q25, which form current sources for the transconductance amplifiers, are connected in common with the base of the output end transistor Q26 of a current mirror circuit. Here, the reference characters C through J in FIG. 7 represent ammeters.

For comparison with the performance of the prior art circuit, FIG. 7 also refers to the DC biases at main nodes in cases where the power-supply voltage is set to 1.05 V, the bias to the analog ground line (AC-grounded line) to 0.88 V and the capacity C10 to 100 pF. These DC biases were determined based on the results of a simulation with a circuit simulator such as AWB or SPICE.

The results of the simulation prove that according to the present embodiment, the DC biases to the respective input terminals and output terminals of the transconductance amplifiers are 880 mV with an accuracy of approximately ±5 mV (reference should be made to the values at nodes K, L, M and N in FIG. 7) and are thus exceedingly stable. In contrast to this, with the circuit proposed by the prior art which has been explained above with reference to FIG. 4, the biases have a maximum deviation of 570 mV from the center at 880 mV (the DC bias at the collector node K of the differential transistors of the first transconductance amplifier 1 is 309 mV). In conclusion, the present embodiment provides exceedingly stable DC biases as compared with those of the prior art.

Also according the present embodiment, the value of the grounded inductance is greatly lowered as evidenced by the series resistance component r=1.3 kΩ for Zin=22.5 kΩ in cases where f=500 kHz. According to the characteristic figures of the inductance, since Q=17.3 and PHASE=86.7 deg (Q=1.17 and PHASE=30.6 deg according to the prior art circuit), and Q is approximately 20 according to the characteristics of a coil actually used as a passive component, the grounded inductance according to the present embodiment is determined to be capable of operating satisfactorily as a practical grounded inductance.

The explanation will now be focused on an actual circuit realizing the grounded inductance using a gyrator circuit according to another embodiment of this invention.

Figure 8:
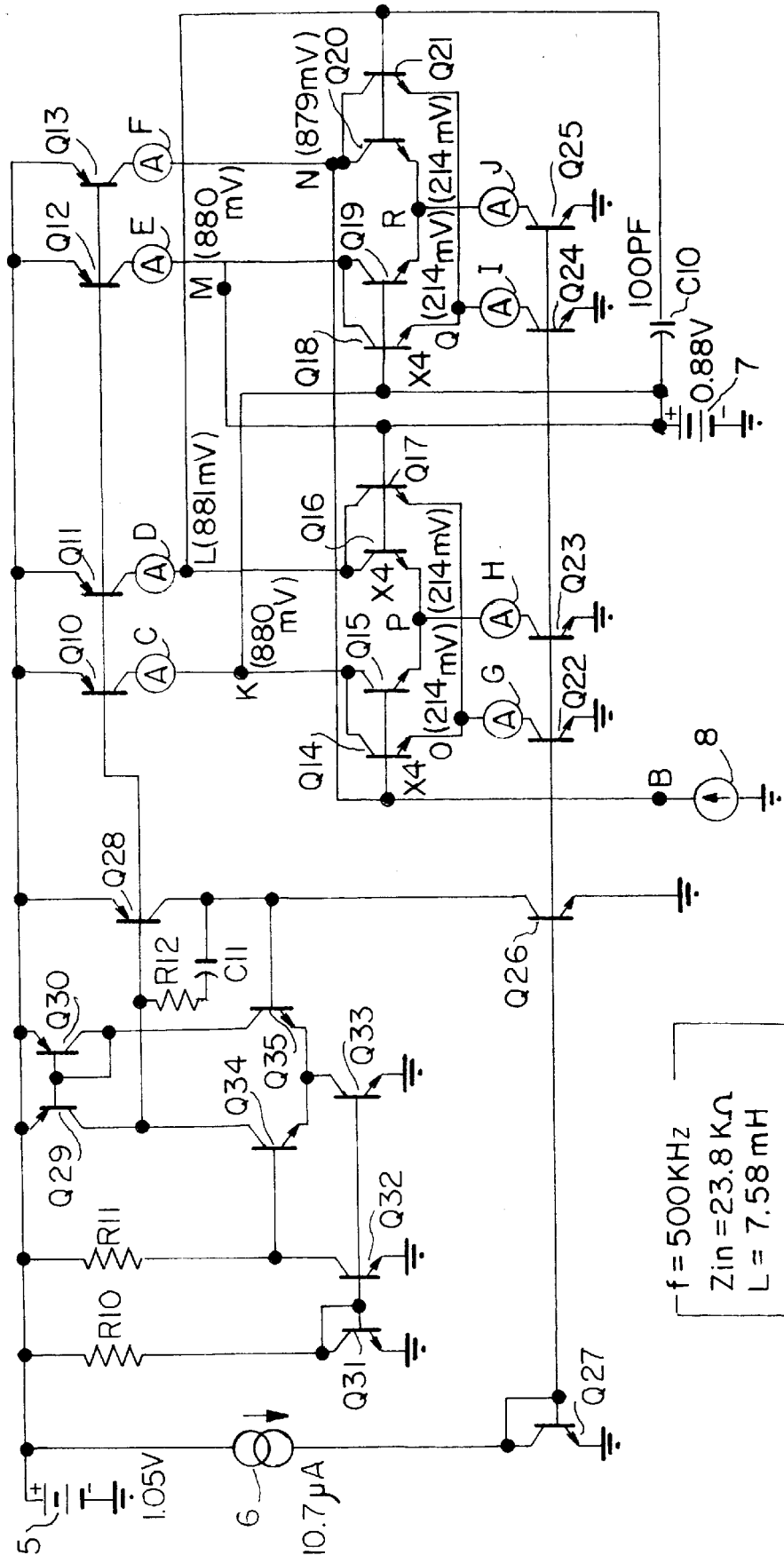
FIG. 8 is another circuit diagram illustrative of the grounded inductance using a gyrator circuit according to another embodiment of this invention.

FIG. 8 is another embodiment of the circuit of the grounded inductance using a gyrator circuit according to this invention.

As shown in FIG. 8, regarding the current sources for the first and the second transconductance amplifiers, the NPN transistors (Q22 through Q25) are connected along a base common line in the same manner as in the first embodiment, whereas the current-loading PNP transistors (Q10 through Q13) are connected to a current amplifier constructed with a pair of differential transistors Q34, Q35 and a current mirror circuit (Q29, Q30). As a result, outputs of the current amplifier are inputted to the base of the transistor Q28, and its collector current is inputted to the current amplifier as feedback to control fluctuation of the base current of the transistor Q28; consequently the base currents of the PNP transistors Q10, Q11, Q12 and Q13 which load the first and the second transconductance amplifiers with current are controlled in a like manner, thereby controlling their collector currents (load currents) to given values.

The drawing also refers to the main DC biases in cases where the power-supply voltage is set to 1.05 V, the vias to the analog ground line to 0.88 V and the capacitor to 100 pF. These DC biases were determined based on the results of a simulation with a circuit simulator such as AWB or SPICE. Here, the bias applied to the current amplifier is controlled so as not to saturate the transistors.

The results of the simulation reveal that the DC biases applied to the respective input terminals and output terminals of the OTAs are 880 mV with an accuracy of ±1 mV (the prior art circuit produces a maximum deviation of 570 mV from the center at 880 mV) and thus are exceedingly stable as compared with the performance of the prior art circuit.

Also according the present embodiment, the value of the grounded inductance is greatly lowered as evidenced by the series resistance component r=1.18 kΩ for Zin=23.8 kΩ in cases where f=500 kHz. According to the characteristic figures of the inductance, since Q=20.17 and PHASE=87.2 deg (Q=1.17 and PHASE=30.6 deg for the prior art circuit), the grounded inductance according to the present embodiment is determined to be capable of operating satisfactorily as a practical grounded inductance.

As described above, this invention has the effect of providing grounded inductance characteristics, being free of DC bias fluctuation and having an exceedingly stable bias balance. The present invention also allows construction of a high-Q grounded inductance circuit.

Also, since the first and the second transconductance amplifiers are constructed as current-loaded circuits, and the current sources are constructed with a current amplifier, this invention has the additional effect of providing excellent grounded inductance characteristics, since the load current fluctuation is minimized, and the biases are balanced in an exceedingly stable manner. Also, a high-Q grounded inductance circuit may be constructed according to the present invention.

While the invention has been described with reference to specific embodiments thereof, it will be appreciated by those skilled in the art that numerous variations and modifications of the embodiments are possible, and accordingly, all such variations and modifications of the embodiments are to be regarded as being within the spirit and scope of the invention.

What is claimed is:

1. A grounded inductance circuit comprising a gyrator circuit; said gyrator circuit comprising first and second transconductance amplifiers each having two input terminals and two output terminals, wherein a first input terminal of said first transconductance amplifier is connected with a second output terminal of said second transconductance amplifier;

a first output terminal of said first transconductance amplifier and a first input terminal of said second transconductance amplifier are connected to one end of a capacitor which is grounded at the other end; and a second input terminal and a second output terminal of said first transconductance amplifier and a second input terminal and a first output terminal of said second transconductance amplifier are AC-grounded, respectively.

2. The grounded inductance circuit as claimed in claim 1, wherein said first and second transconductance amplifiers are constructed as current-loaded circuits, and the current sources for the load currents are constructed with a current amplifier.

3. The grounded inductance circuit as claimed in claim 2, wherein said first transconductance amplifier comprises a pair of first differential transistors; a pair of second differential transistors with bases and collectors connected in common with those of said pair of first differential transistors; a pair of current-loading, third transistors; and a pair of fourth transistors which are connected in common with emitters of said pairs of first and second differential transistors and make up constant-current sources.

4. The grounded inductance circuit as claimed in claim 3, wherein said second transconductance amplifier comprises a pair of fifth differential transistors; a pair of sixth differential transistors with bases and collectors connected in common with those of said pair of fifth differential transistors; a pair of current-loading, seventh transistors; and a pair of eighth transistors which are connected in common with emitters of said pairs of fifth and sixth differential transistors and make up constant-current sources.

5. The grounded inductance circuit as claimed in claim 4, wherein the respective bases of said third and seventh transistors are connected in common with the base of a ninth transistor with its collector and base connected to each other, and the bases of said fourth and eighth transistors are connected in common with the base of the output end transistor of a pair of tenth transistors which form a current mirror circuit.

6. The grounded inductance circuit as claimed in claim 4, wherein the respective bases of said third and seventh transistors are connected to said first transconductance amplifiers and said current amplifier.

* * * * *